United States Patent
Tsironis

(10) Patent No.: US 12,265,101 B1
(45) Date of Patent: Apr. 1, 2025

(54) LOAD PULL TUNER FOR WAVEGUIDE WAFER PROBE

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 160 days.

(21) Appl. No.: 18/133,554

(22) Filed: Apr. 12, 2023

(51) Int. Cl.
*G01R 31/26* (2020.01)
*G01R 1/02* (2006.01)
*G01R 1/04* (2006.01)
*G01R 1/067* (2006.01)
*G01R 1/073* (2006.01)
*G01R 27/00* (2006.01)
*G01R 27/04* (2006.01)
*G01R 31/28* (2006.01)
*G01R 35/00* (2006.01)
*H01P 3/02* (2006.01)
*H01P 5/08* (2006.01)

(52) U.S. Cl.
CPC ..... *G01R 1/07378* (2013.01); *G01R 1/06755* (2013.01); *H01P 3/023* (2013.01); *H01P 5/08* (2013.01)

(58) Field of Classification Search
CPC ........ G01R 31/02; G01R 31/26; G01R 31/28; G01R 31/2822; G01R 27/00; G01R 27/04; G01R 1/02; G01R 1/04; G01R 1/067; G01R 1/06755; G01R 1/073; G01R 1/07378; G01R 35/00
See application file for complete search history.

(56) References Cited

U.S. PATENT DOCUMENTS

| 5,910,754 | A | 6/1999 | Simpson et al. | |
| 6,674,293 | B1 | 1/2004 | Tsironis | |
| 7,053,628 | B1 | 5/2006 | Tsironis | |
| 10,700,402 | B1 * | 6/2020 | Tsironis | ............. G01R 31/2612 |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
W Band Programmable Tuner Model 11075, Product Note PN-43, Focus Microwaves, Aug. 1997.
"5 Challenges for Probe Tip Sub-THz Measurements" [online], FormFactor [retrieved on Feb. 28, 2023] Retrieved from Internet <URL: www.formfactor.com/blog/ 2018/challenges-for-probe-tip-sub-thz-measurements/>.

(Continued)

*Primary Examiner* — Neel D Shah

(57) ABSTRACT

A waveguide to wafer-probe adapter includes an integrated computer-controlled load pull tuner forming a compact and handy assembly. The adapter includes a horizontal, a vertical and a sloped straight section, joined with two knee junctions. The tuner is simple and includes two, only along the sloped waveguide section moving at fixed penetration tuning probes without cumbersome vertical axis mechanisms. The sloped cavity section of the waveguide includes niches at the knee junctions, in which the probes can be moved and hidden, thus allowing a for low residual reflection and original transmission behavior. When the probes are hidden the adapter can be used for instantaneous s-parameter measurement still maintaining full load pull capacity. High-speed calibration and tuning algorithms allow efficient operation.

9 Claims, 14 Drawing Sheets

(56) References Cited

OTHER PUBLICATIONS

"Linear Actuator" [online], Wikipedia [Retrieved on 04/25/202] Retrieved from Internet <URL: https://en.wikipedia.org/wiki/Linear_actuator>.
"A Computer-Controlled Microwave Tuner for Automated Load Pull", Sechi F, et al., RCA Review, vol. 44, Dec. 1983, pp. 566-583, figure 5.
Measuring Noninsertable Devices, Agilent 8510-13, Product Note [online], Carlton University [Mar. 30, 2023] Retrieved from Internet <URL: 5956-4373E.pdf (carleton.ca)>.

* cited by examiner

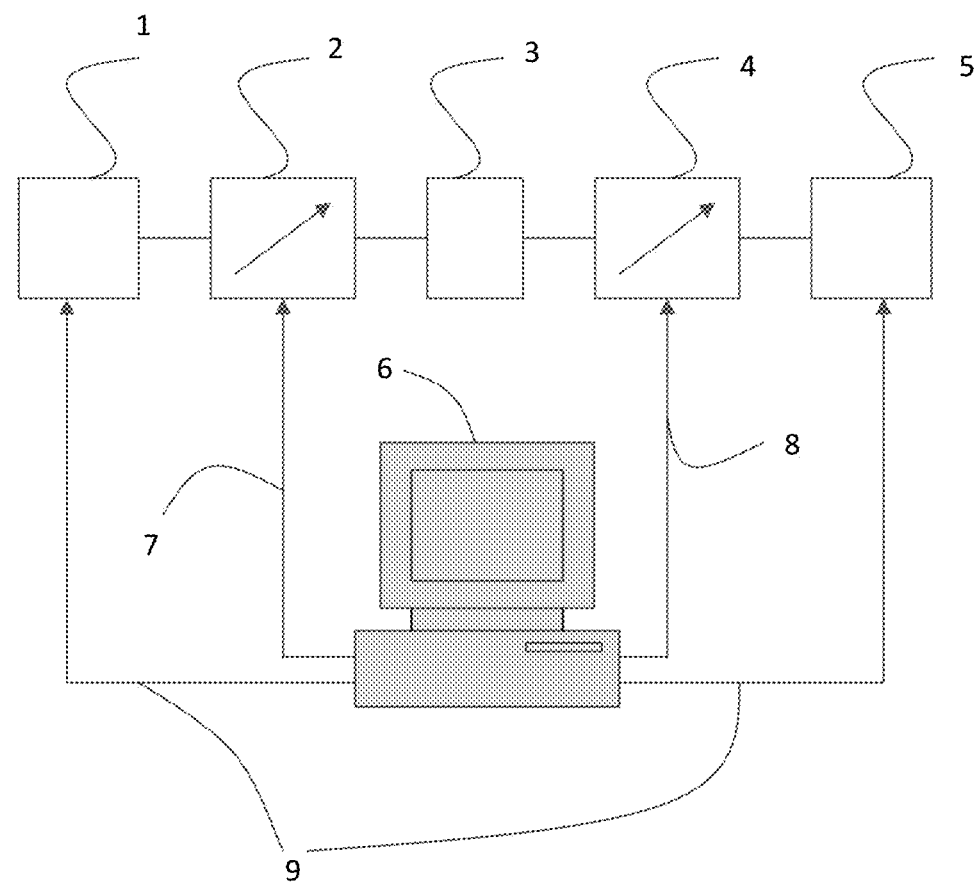
FIG. 1: Prior art

FIG. 2A: Prior art
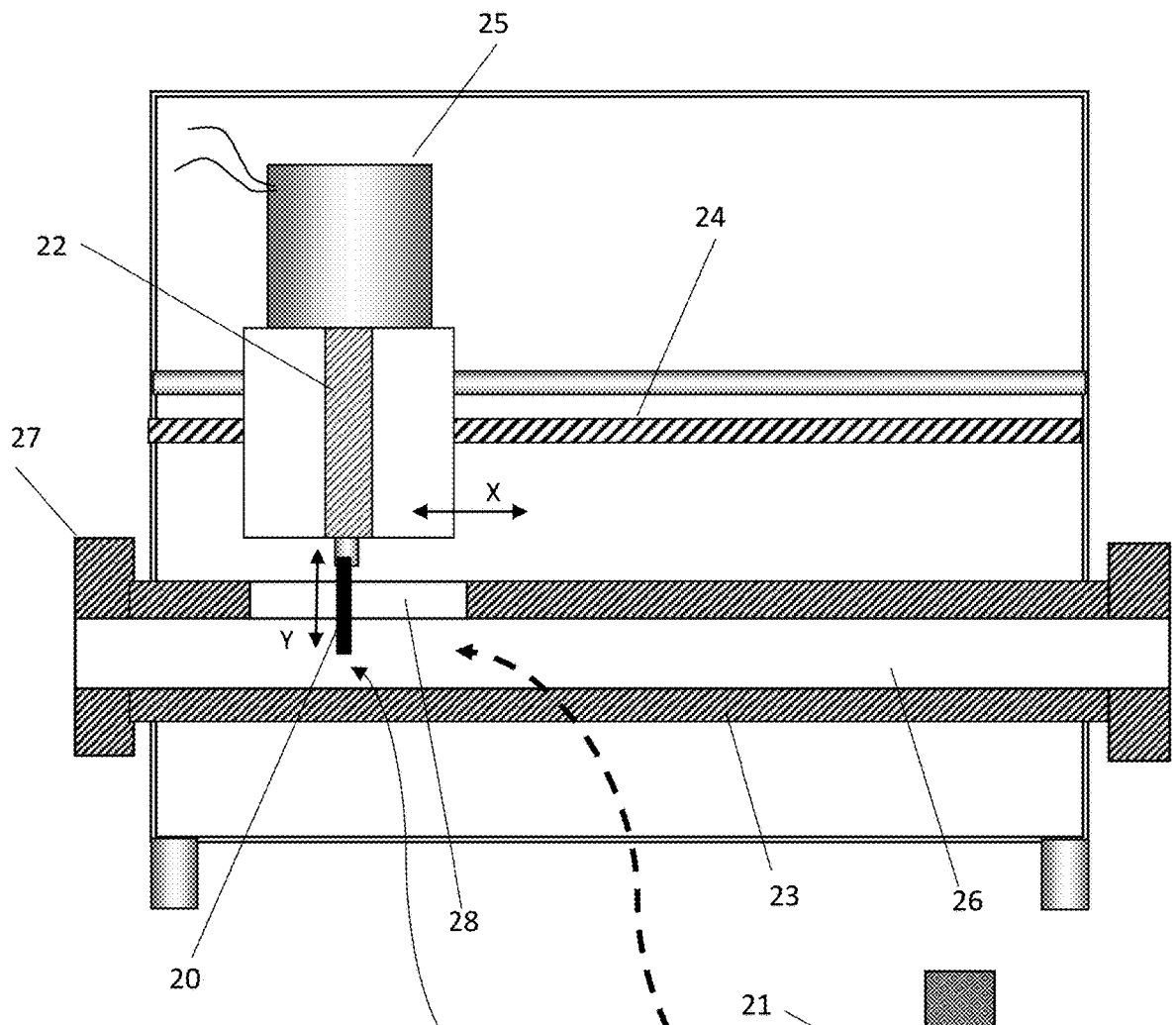
FIG. 2B: Prior art
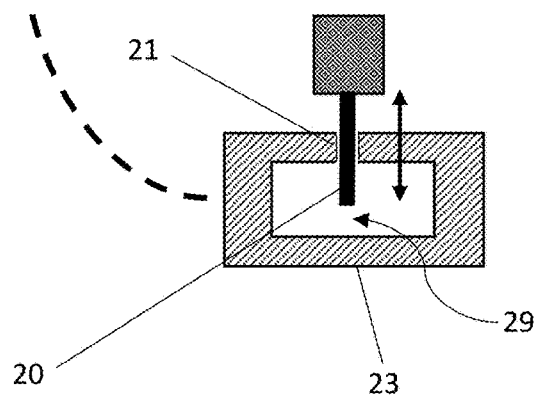

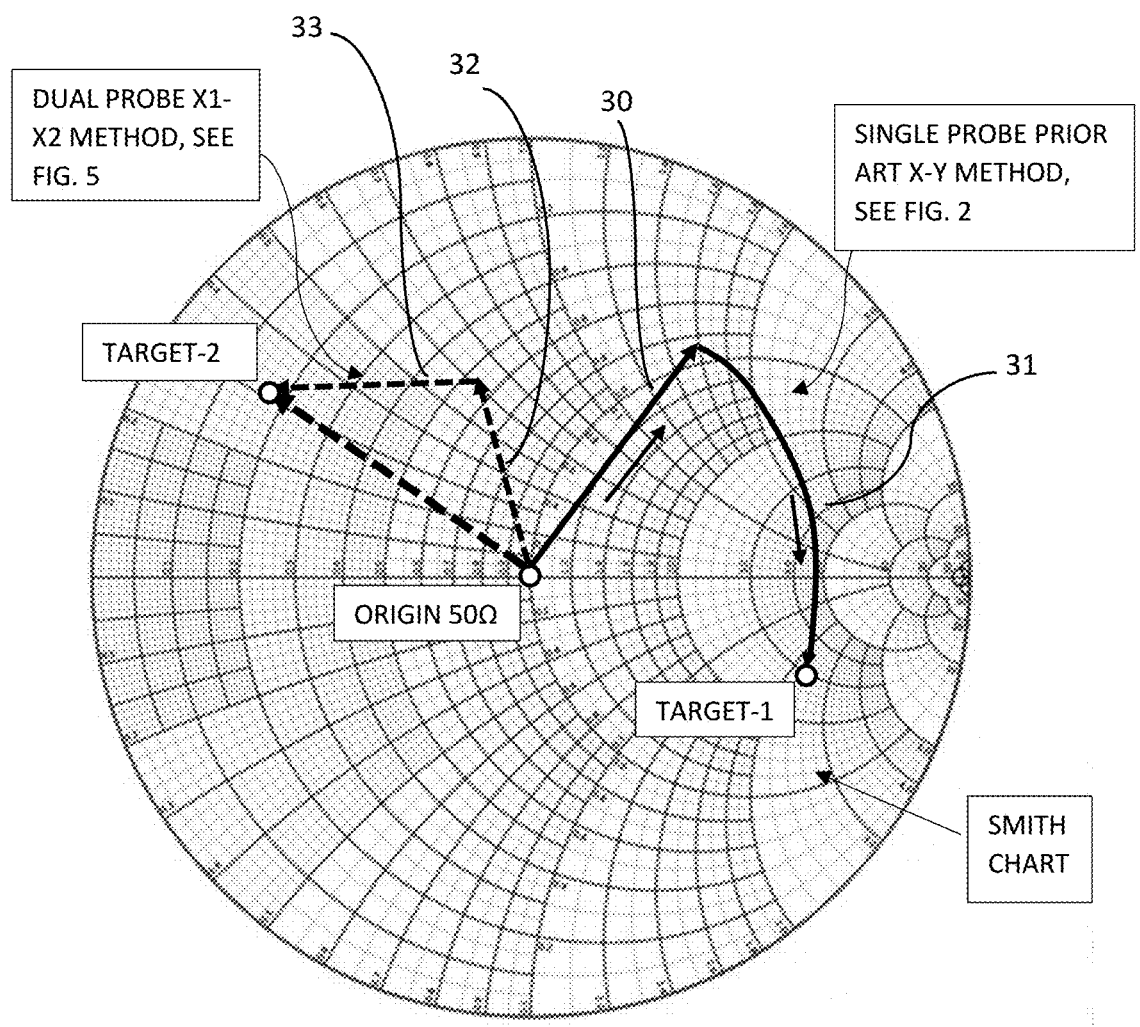
FIG. 3: Partly prior art

LOAD PULL TUNER FOR WAVEGUIDE WAFER PROBE

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL: http://en.wikipedia.org/wiki/Load_pull>
2. W Band Programmable Tuner Model 11075, Product Note PN-43, Focus Microwaves, August 1997.
3. Tsironis C., U.S. Pat. No. 6,674,293, "Adaptable Pre-Matched Tuner System and Method".
4. Simpson G., et al., U.S. Pat. No. 5,910,754, "Reduced height waveguide tuner for impedance matching", FIG. 8.
5. "5 Challenges for Probe Tip Sub-THz Measurements" [online], FormFactor [retrieved on 02/28/23] Retrieved from Internet <URL: www.formfactor.com/blog/2018/challenges-for-probe-tip-sub-thz-measurements/>
6. "Linear Actuator" [online], Wikipedia [Retrieved on Apr. 25, 2020] Retrieved from Internet <URL: https://en.wikipedia.org/wiki/Linear_actuator>.
7. "A Computer-Controlled Microwave Tuner for Automated Load Pull", Sechi F, et al., RCA Review, Vol 44, December 1983, pp. 566-583, FIG. 5.
8. Tsironis, C.: U.S. Pat. No. 7,053,628, "High reflection microwave tuner using metal-dielectric probe and method".
9. "Measuring Noninsertable Devices, Agilent 8510-13, Product Note [online], Carlton University [03/30/2023] Retrieved from Internet <URL: 5956-4373E.pdf (carleton.ca)>

BACKGROUND OF THE INVENTION

This invention relates to load and source pull testing of millimeter-wave transistors and amplifiers using remotely controlled electro-mechanical waveguide impedance tuners.

A popular method for testing and characterizing RF and millimeter-wave transistors in their non-linear region of operation is "load pull" (see ref 1). Load pull is a semiconductor device (transistor) characterization technique employing automatic microwave impedance (load-pull) tuners and other microwave test equipment as shown in FIG. 1. The waveguide tuners 2, 4 (see ref 2) are used in order to manipulate the microwave impedance conditions under which the Device Under Test (DUT, or transistor, 3) is tested; the stimulus test signal is provided by a signal source 1 and the out-coming power is measured by a power meter 5; the whole is controlled by a PC controller 6, which includes an electronic digital interface to communicate with the instruments 1, 5 and the tuners 2, 4 using control and communication cables 7, 8 and 9.

DESCRIPTION OF PRIOR ART

Waveguide impedance tuners include, in general, a low-loss waveguide transmission line 26, FIG. 2A, and a conductive tuning element (tuning probe, 20) inserted in a slot 28 machined into the waveguide 23 parallel to its longitudinal axis; the tuning probe #20 is a, at least partly, conductive rod, block, pellet or stub, is attached to a complex, high precision, adjustable vertical axis 22, controlled by a stepper motor 25 and is inserted vertically into the slot 28 machined into broad wall of the waveguide and moved along the axis of the waveguide using a gear such as an ACME screw 24; this movement of the tuning probe creates, in a certain frequency range, a controllable variable reactance which allows the synthesis of various impedances (or reflection factors) which are present at the test port 27, covering the quasi totality of the Smith chart (the polar impedance mapping display shown as normalized reflection factor, FIG. 3). The prior art impedance synthesis using the tuning probe #20 follows a path 30, 31 between the matched load at the origin (50Ω) of the Smith chart and an arbitrary reflection factor TARGET-1. Inserting the tuning probe into the slot creates a controlled reflection following path 30 and moving the tuning probe along the slot controls the phase following path 31. The relation between reflection factor Γ and impedance Z is given by $\Gamma=(Z-Zo)/(Z+Zo)$, wherein $Z=R+jX$ and wherein Zo is the characteristic impedance. A typical value used for Zo is 50 Ω.

When conductive tuning probes (typically metallic or metalized rods) 20, FIG. 2, penetrate the waveguide 26, they capture and deform the electric field, which is then concentrated in the area 29 between the bottom tip of the tuning probe #20 and the ground plane 23 of the waveguide. This field deformation creates a capacitive effect, sends injected signal power back and allows generating high and controllable reflection factors. The main disadvantage of this embodiment is the requirement for high precision and resolution and, by consequence, tall and cumbersome vertical tuning probe movement mechanisms 22, see ref. 4, which must be very precise, especially when the tuning probe is at maximum depth, very close to the bottom of the waveguide but also over the entire travel range; because of a hyperbolic behavior of the capacitance created, since the significant portion of reflection occurs when the tuning probe tip is very close to the bottom inner wall of the waveguide 23 (ground plane) and because the vertical resolution is constant over the entire travel, the high resolution and accuracy needed close the Gamma Max is obligatory over the whole travel. This movement process slows down the tuning procedure for these two reasons: (a) when the tuning probe is withdrawn, the vertical movement is lengthy and much less effective in terms of generating useful reflection factor increments, and (b), since the vertical moving resolution must be constant, enhanced positioning accuracy and resolution are required all the way due to high tuning sensitivity in the high reflection area, when the tuning probe is deeply inserted and close to the ground plane.

Related prior art (see ref. 4) does not teach impedance tuners with two fixed penetration (or vertical position) tuning probes, having the capacity of wideband neutral (low reflection close to 0 state), since either tuning probe creates a fixed reflection and it is only possible to cancel them at only at one frequency when the tuning probes are λ/4 apart; prior art tuners require at least one high precision complex vertical axis to be able to tune along path 30-31 in FIG. 3. Neither relevant prior art (see ref. 3 or 4) teach a short tuner using tuning probes sharing the same section of waveguide transmission line and alternatively crossing over. This overlapping structure, though, is essential and compatible with the proposed low profile, compact size tuner and also attractive, because it allows straightforward integration in a wafer-probe waveguide adapter; a dedicated high-speed calibration of the high-speed adaptive tuner calibration and operation, which is similar to the basic calibration concept of ref. 3, but, because of the overlapping of the tuning probes, is not identical to it.

BRIEF SUMMARY OF THE INVENTION

The invention discloses a first of a kind integration of load pull tuner and wafer-probe to waveguide adapter (see ref. 5 and FIG. 14) and associated calibration and tuning procedures. The tuner uses, other than the totality of the prior art, a horizontal-only movement mechanism of the permanently inserted tuning probes but can also be configured remotely to a minimum wideband reflection "initialization" state previously unknown in such structures (see ref. 7 and 8).

The impedance tuner itself, of which a conceptual cross section is shown in FIG. 5, uses a low loss waveguide transmission line 57 and two tuning probes 55 and 56. The tuning probes are, typically, at least partially conductive rods or pellets and are mounted on mobile carriages 53, 53A, inserted in slots 58 and 59 and slide along the waveguide transmission line. The carriages slide seamlessly and precisely along the waveguide walls guided by high precision sliders. The carriages hold the tuning probes (conductive rods) 55, 56 and keep them inserted into the waveguide cavity at a fixed depth through the vertical slots 58, 59 in a non-contacting relationship with the slot walls 21 as shown in FIG. 2. The slots run parallel to the axis of the waveguide. This tuning mechanism does not require any vertical tuning probe control. A medium size reflection (S11≈0.5-0.7) is created by either tuning probe at the test port 50 leading to the different tuning mechanism as shown in FIG. 3 (traces 32, 33). Both tuning mechanisms shown in FIG. 3 perform the same tuning objective: starting from the matched load (50Ω) they allow tuning to TARGETS-1 or -2. The result is the same, only the control mechanisms differ.

The carriages 53, 53A are controlled using high-speed electric stepper motors 54, 501 and ACME rods 502 or linear actuators (see ref. 6) eliminating this way additional control gear. Last, not least, the tuning mechanism, liberated from cumbersome and expensive high resolution vertical tuning probe control and movement delays, benefits also from inherent lower tuning error sensitivity to mechanical tuning probe positioning tolerances close to $|\Gamma|\approx1$.

BRIEF DESCRIPTION OF THE SEVERAL VIEWS OF THE DRAWINGS

The invention and its mode of operation will be better understood from the following detailed description when read with the appended drawings, in which:

FIG. 1 depicts prior art: a typical generic automated load pull test system.

FIGS. 2A through 2B depict prior art: a single tuning probe waveguide impedance tuner; FIG. 2A depicts a front view of the entire tuner; FIG. 2B depicts a cross section of the tuning probe (typically a conductive rod) entering the waveguide slot.

FIG. 3 depicts partly prior art: a Smith chart and two possible trajectories of impedance synthesis (tuning) to reach a target impedance starting from the origin of 50Ω. Reaching TARGET-1 uses the prior art single-tuning probe technique with horizontal and vertical control; reaching TARGET-2 uses the new two-tuning probe method with horizontal-only and without vertical control.

DETAILED DESCRIPTION OF THE INVENTION

Figure 4:
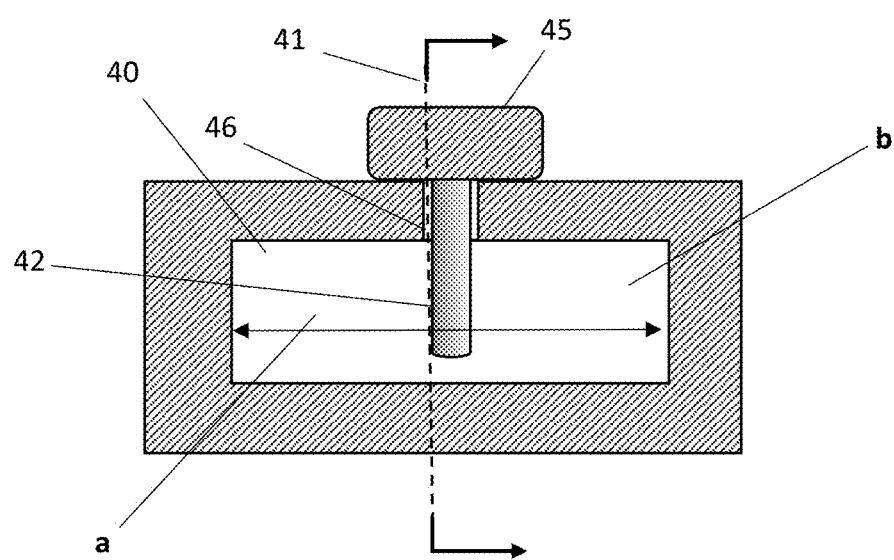
FIG. 4 depicts a cross-section through a waveguide with conductive tuning rods (tuning probes) entering contactless into vertical slots.
Figure 5:
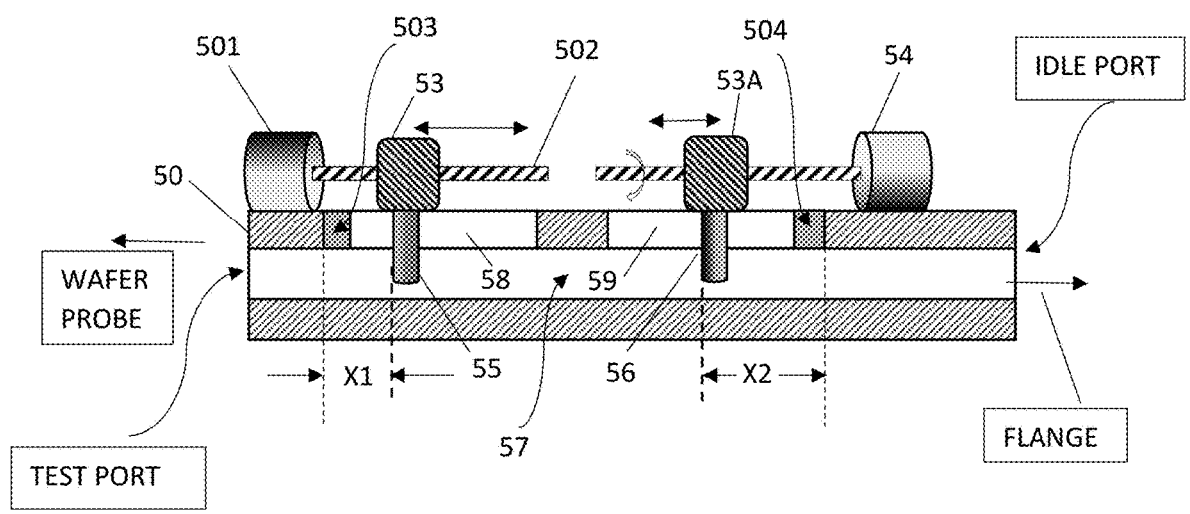
FIG. 5 depicts a front view of the sloped section of the waveguide tuner with two cascaded tuning probes.

This invention discloses a high frequency (millimeter wave) waveguide-to-wafer-probe (WG2WP) adapter with integrated computer-controlled load-pull impedance tuner, suitable for noise and load pull measurements; if the assembly is used at the input of the DUT it can be used for noise measurements, if it is used at the input and output of the DUT it can be used for source and load-pull. Since the wafer-probe heads in the WG2WP adapter include bias networks, full biasing and load-source pulling is straight forward. A cross section of the waveguide 40 with the slot 46 and the reflective tuning probe 42 is shown in FIG. 4; the tuning probe is attached to the mobile carriage 45, which slides seamlessly on the top wall of the waveguide using some kind of slider. A section 41 along the waveguide is shown in FIG. 5.

The integrated tuner portion of the WG2WP can be initialized, i.e., the tuning probes can be withdrawn from the transmission line, this allows wideband low reflection operation and also in-situ DUT s-parameter measurement. The tuning section integrated in the WG2WP adapter (FIG. 5) uses a low loss waveguide transmission airline 57, which includes two broad top walls, two narrow sidewalls and two separate slots 58, 59, cut into the broad wall. The slots run parallel to the waveguide longitudinal axis and are positioned partly inside the waveguide cavity 57 and partly inside the bends 115, 117 (FIG. 11), shown here symbolically as items 503, 504, also shown as area "probe initialized" in FIG. 10. This structure is chosen for allowing the tuning probes to be withdrawn from the cavity of the waveguide without being lifted. The horizontal control of the carriages 53 and 53A can be made using stepper motors 54, 501 and ACME screws 502 but can also be accomplished using linear electric actuators (see ref. 6), instead of motors 54, 501 and ACME screws. The actuators have a motorized body, and their rotor axis is the extended horizontal ACME screw 502.

The total reflection factor 105 (FIG. 6) is the sum of all internal reflections in the waveguide and a function of the positions X1 and X2 of the two tuning probes: S11(X1, X2) and is the vector-sum of the reflection factors 103 and 104 of both tuning probes S11(X1) and S11(X2): S11(X1, X2)=S11(X1)+S11(X2), all referenced at the test or initialization port 50. The tuning probe 55 closest to the test port generates the primary reflection contour 100 i.e., S11(X1), 103. Since the reflection of the first tuning probe 55 is selected not to be maximum (i.e. >0.9), but is, instead, selected to have medium value $|S11(X1)|\approx 0.5$-$0.7$, there is a signal portion traversing tuning probe 55 towards the secondary tuning probe 56; this signal portion is then reflected back towards the primary tuning probe 55; again, a portion of this reflected back signal traverses the primary tuning probe towards the test port and adds to the total reflection. The signal reflected at the secondary tuning probe 56 is also reflected back at the primary tuning probe 55, and so on . . . creating the phenomenon of a multiple reflection. In mechanical terms this appears like a turbulence. This back and forth bouncing of signal can be well described using signal flow graphs, but a mathematical description is here useless, since the system and all its side-effects is calibrated as is.

Figure 6:
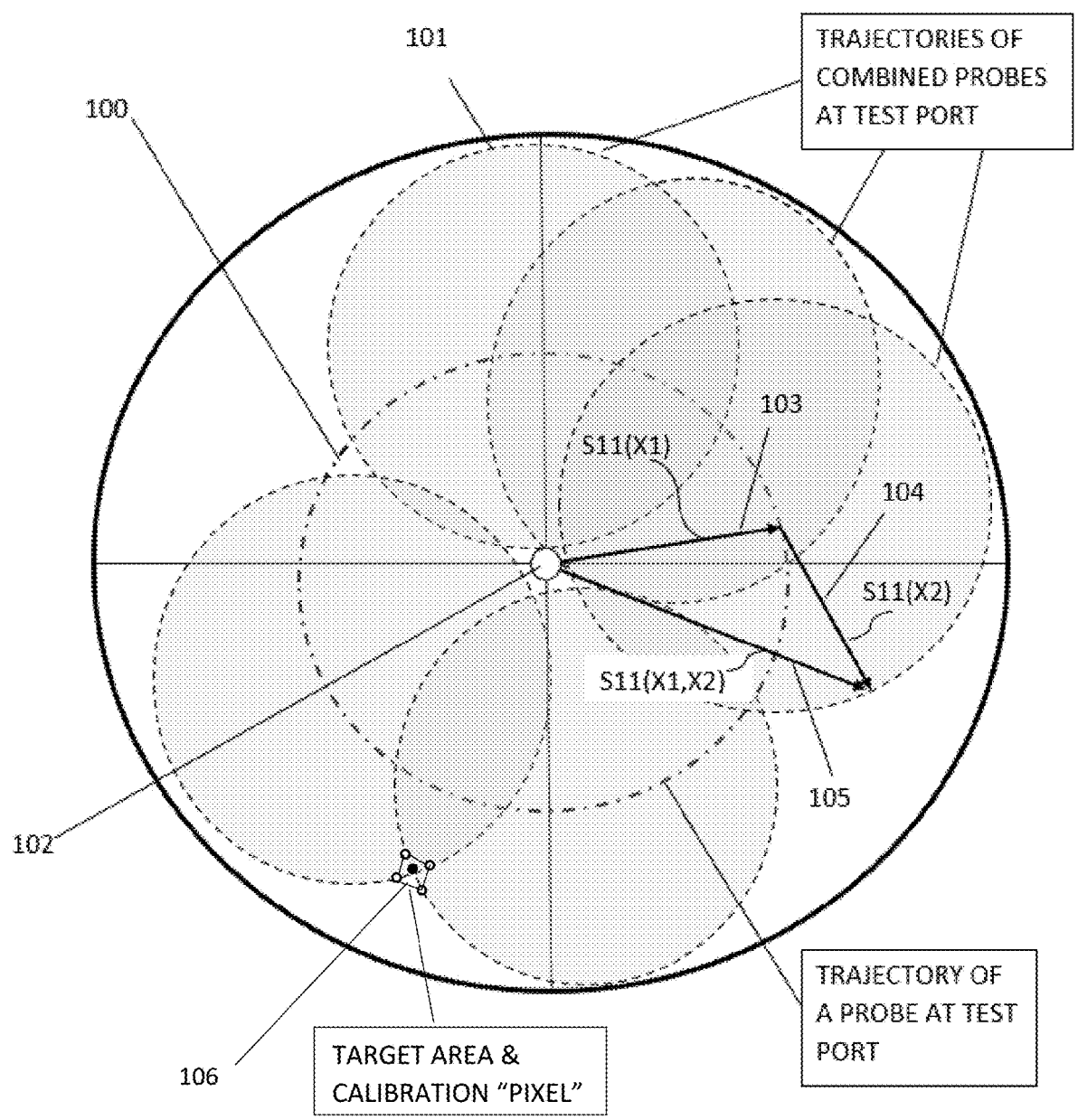
FIG. 6 depicts the impedance synthesis trajectories on the Smith chart using the two-tuning probe impedance tuner with fixed tuning probe insertion depth.

FIG. 6 depicts schematically the overall reflection factor synthesis mechanism: each tuning probe creates at its own reference plane reflections $\Gamma_1$ or $\Gamma_2$, which are concentric reflection factor circles represented at test port reference plane as trace 100 on the Smith chart (FIG. 6). The total reflection factor traces 101 are created by a planetary epicycloid superposition of the two reflection factor vectors around the center 102 (one circle rotates around a point on the periphery of the other). The total reflection factor vector 105 is created by the vector sum of vector 103 (from the first tuning probe) and vector 104 (from the second tuning probe) as described above.

Figure 7:
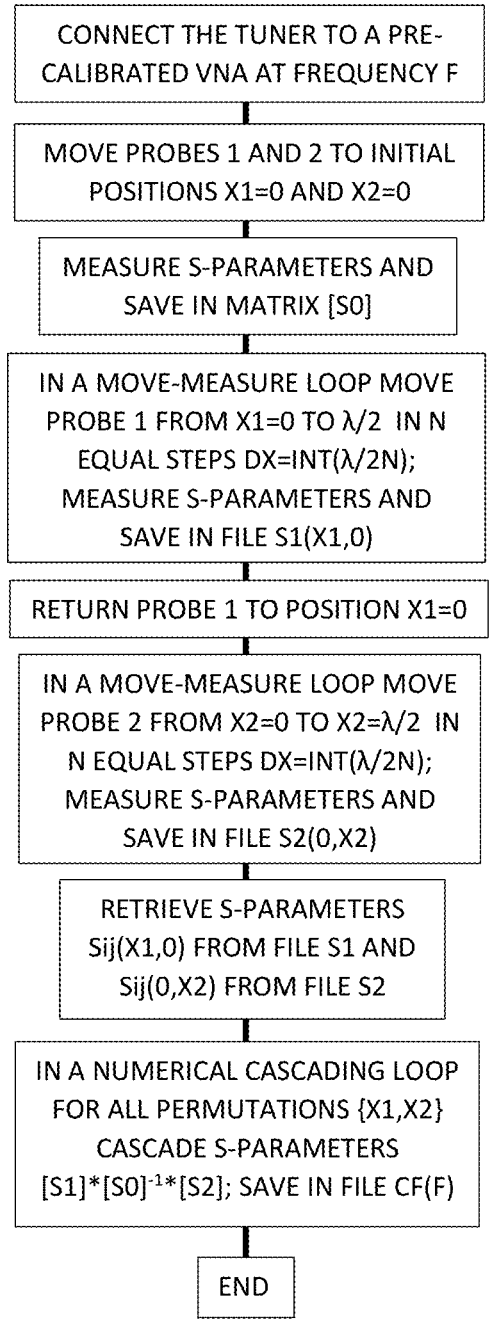
FIG. 7 depicts the tuner calibration flow-chart.

The calibration procedure is outlined in FIG. 7: Each probe is moved at equal steps between the initialization state and $\lambda(F)/2$ and s-parameters are measured. S-parameters of the first probe (closest to the test port) are left intact; the s-parameters of the second probe are de-embedded with the invers initialization matrix [S0], measured when both probes are at third initialization position. Subsequently the s-parameters associated with both probes are cascaded in memory and saved in a tuner calibration file.

Figure 10:
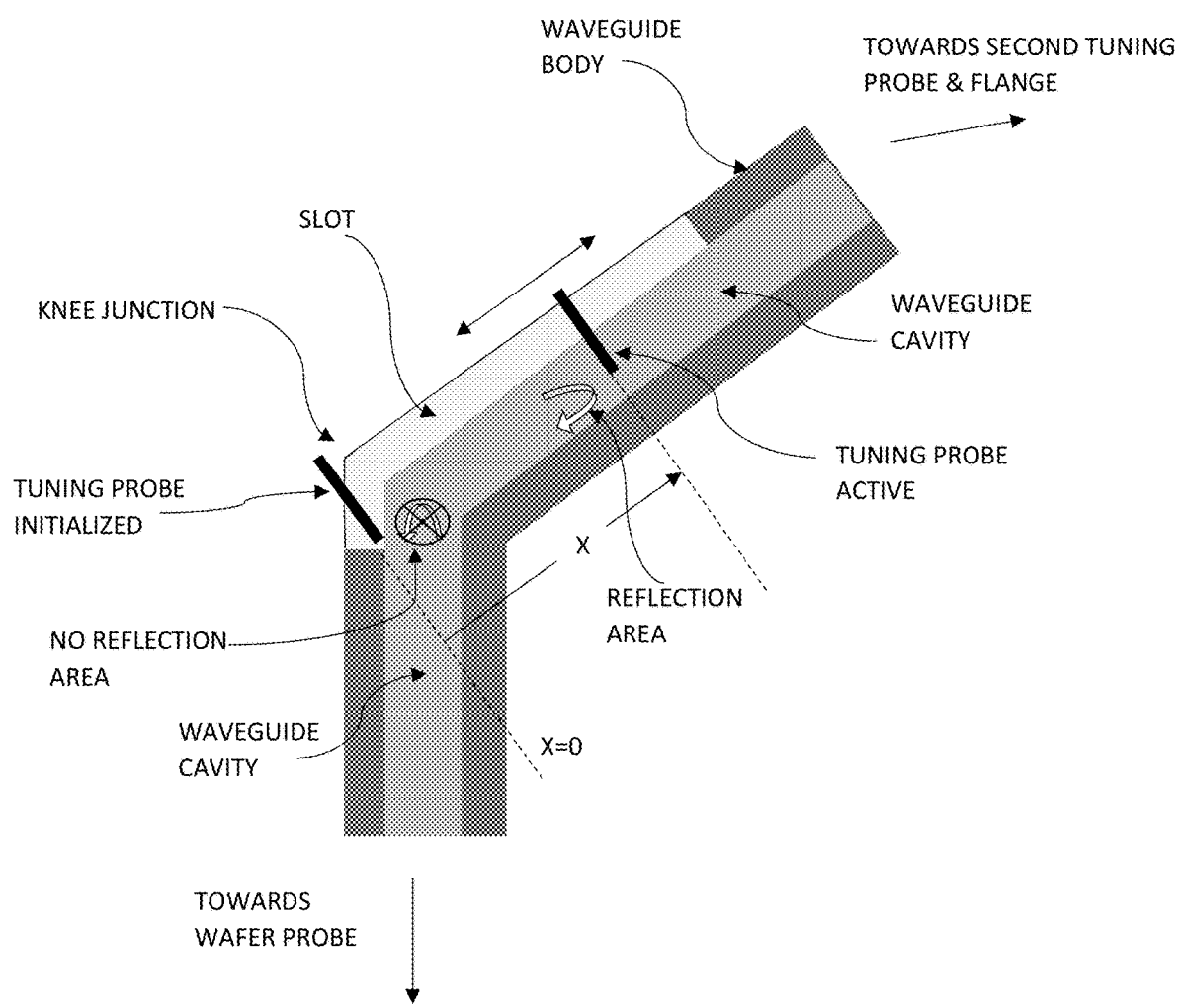
FIG. 10 depicts details of the slot structure and the initialization protrusion.
Figure 11:
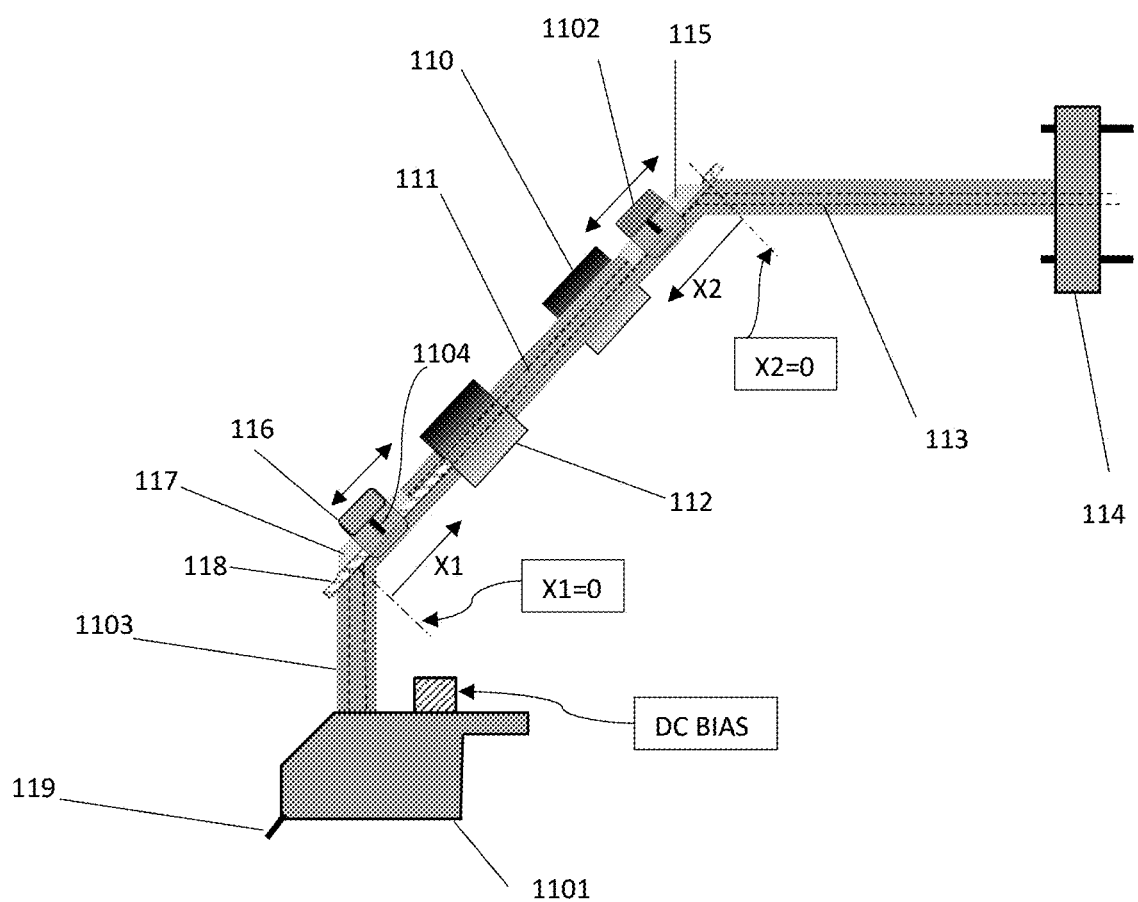
FIG. 11 depicts a side view of the integration.

The waveguide-to-wafer-probe (WG2WP) adapter with integrated load pull tuner is shown in FIG. 11: we distinguish the waveguide flange 114, the horizontal waveguide section 113, the sloped section 111 and the vertical section 1103 of the waveguide transmission line. The horizontal section 113 is connected with the flange 114 and has a knee-junction 115 with the sloped section 111, which has a second knee junction 117 with the vertical section 1103, which leads to the wafer-probe head (body) 1101 and coaxially or coplanar, depending on manufacturer, wafer pins 119. The tuning slot is machined into the wall of the sloped waveguide section (behind the ACME screw 118); the tuning probe #1 (1104) is held by the mobile carriage 116, which is moved by the stepper motor 112 and the ACME 118 (which can be replaced by a linear actuator) and carriage 1102 is controlled by stepper motor 110. Carriage 1102 holds a second tuning probe. More details of the tuning, and in particular the provision for a wideband initialization state are shown in further drawings. Here it is important to define the initialization reference planes X1=0 and X2=0 at the points where the slots protrude (117, 115) into the knee junctions (FIGS. 11, 10).

FIG. 10 clarifies the geometry of the sloped-to-vertical knee junction: The tuning slot protrudes into the waveguide body beyond the knee of the waveguide cavity area, shown as: PROBE INITIALIZED: this allows the tuning probe to be moved "out of the way" when initialized at X=0; the structure creates some residual reflection, but low and mechanically and RF-wise repeatable. The remainder of FIG. 10 is self-explaining.

Figure 12:
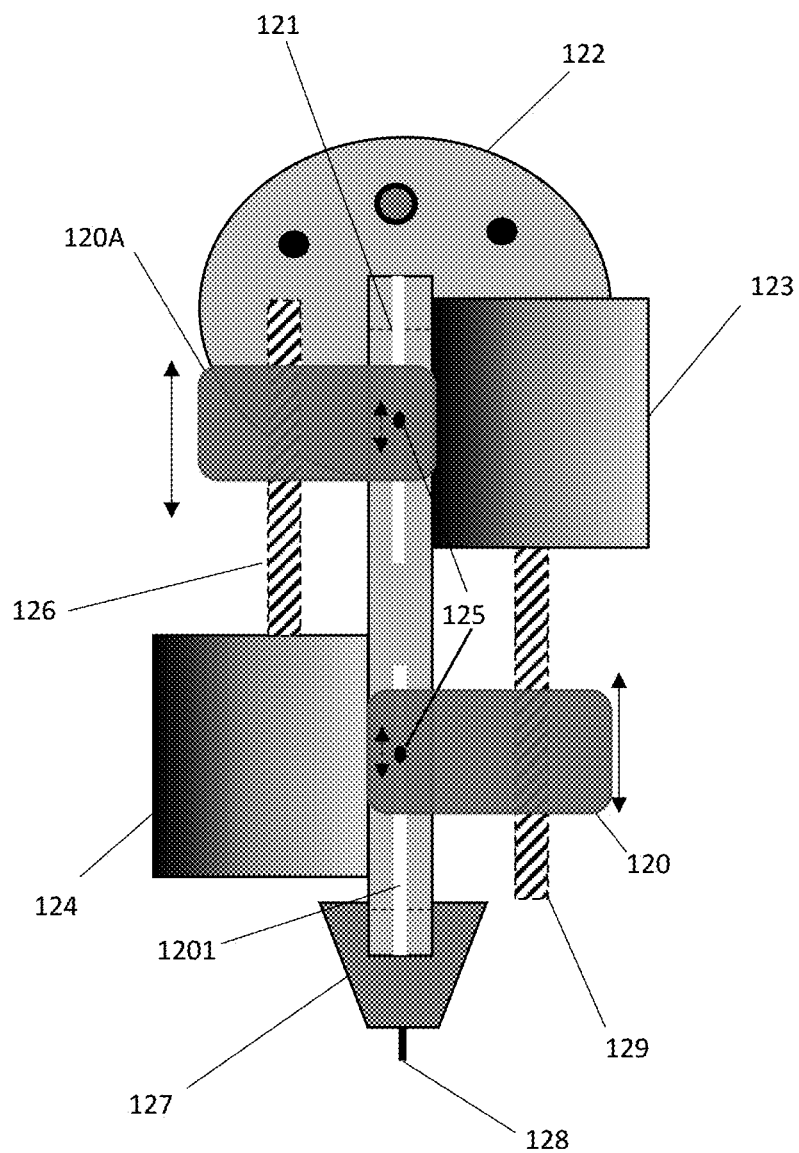
FIG. 12 depicts a top view of the integration.
Figure 13:
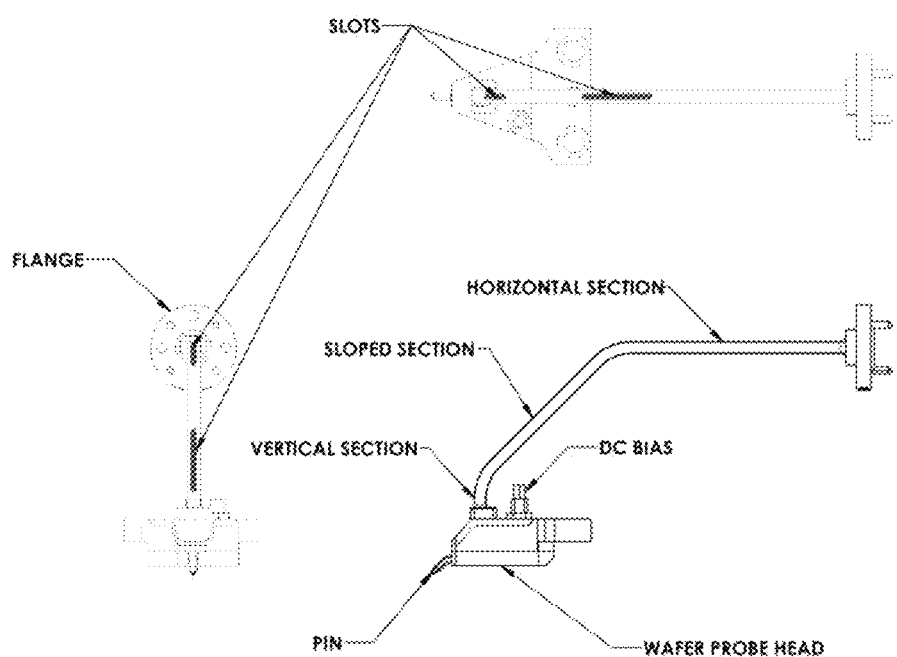
FIG. 13 depicts a commercially available waveguide to wafer-probe adapter assembly prepared for the integration with a load pull tuner with two tuning probes.

A top view of the WG2WP integration with the two-tuning probe tuner is shown in FIG. 12: the stepper motors 123 and 124 control, via ACME 126 and 129, the carriages 120 and 120A, which slide along the waveguide slot 1201 and hold the tuning probes 125 at fixed penetration into the slots. The sloped waveguide section bends at the limit 121 at the top to join (horizontally) the waveguide flange 122 and at the bottom vertically to join the wafer-probe head (body) 127 leading to the probe pins 128.

Figure 14:
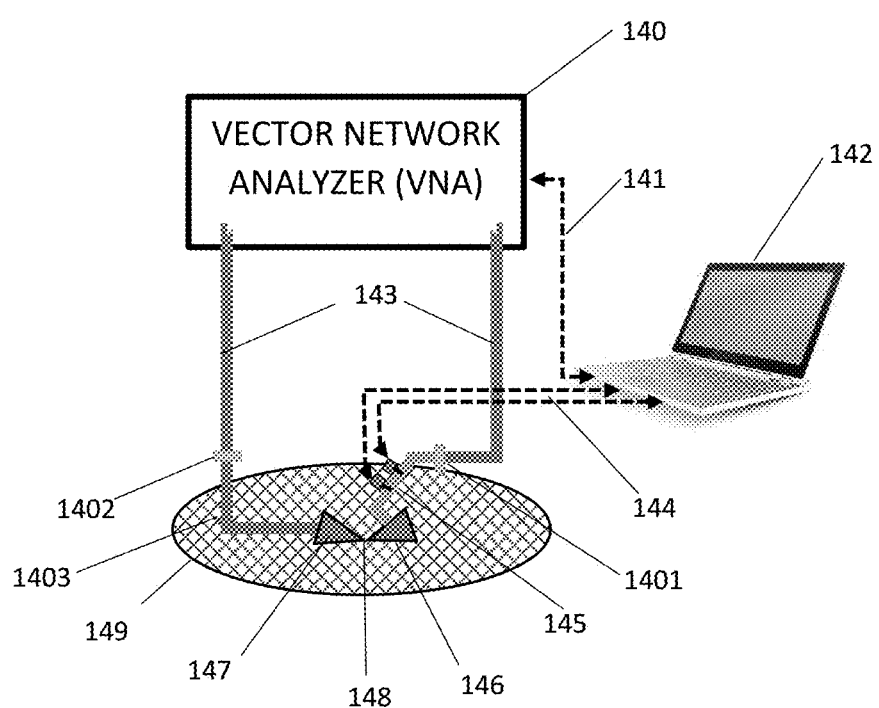
FIG. 14 depicts a measurement setup for calibrating the waveguide to wafer-probe adapter using a vector network analyzer.

A commercially available WG2WP adapter (see ref. 5), used as vehicle for the load pull tuner integration, is shown in FIG. 14. All items, the waveguide flange, the horizontal, sloped and vertical waveguide sections, attached to the wafer-probe body (head), including the outline of the slots machined to receive the tuning probes, are clearly visible.

To be used in impedance synthesis the tuner must be calibrated and the calibration data must be used to generate the proper tuning probe positions to reach a TARGET impedance. In the following, since the tuning probe movement is controlled by stepper motors, it is convenient and meaningful to consider geometrical movements X (including XMAX) in motor steps. If the calibration data are saved in motor steps, then tuning occurs also in motor steps. To create a reasonable accuracy and tuning resolution, each tuning probe of the tuner must be characterized at least at 100 positions between X=0 and X=XMAX=$\lambda$/(2*step-size), even though any number is allowable; the step-size depends on the PITCH of the ACME or an associated control gear; the higher the frequency range the larger the PITCH; in terms of a typical circular trajectory 100 (FIG. 6) this corresponds to steps of 3.6°; using a waveguide class WR19 (40-60 GHz) with internal dimensions of the cavity of a=4.8 mm, b=2.4 mm (FIG. 4) this corresponds at 40 GHz to $\lambda \approx 8$ mm and mechanical increments of 0.04 mm. To calibrate all 100×100=10,000 tuner states (calibration points) one would need at least 10,000 seconds or 2.8 hours, at 1 second delay per point. The new calibration method disclosed here allows reducing this time to approximately 200-250 seconds or 4 minutes.

The calibration procedure executes as follows (FIG. 8): The WG2WP adapter is connected to a pre-calibrated vector network analyzer (VNA); a mixed calibration must be used usually called "adapter removal" calibration method, dealing with un-insertable adapters and cables, such as male-male, female-female, coaxial-microstrip or, as here, wafer-probe to waveguide: one port is a set of wafer-probe tips and the other port a waveguide flange. This type of calibration is possible using the adapter removal method (see ref 9); the on wafer 149 calibration setup is shown in FIG. 14: the waveguide-to-wafer-probe adapter-tuner 145 is shown between the wafer-probe 146 and the waveguide flange 1401, controlled by the PC 142 using digital cables 144; the calibration is not straight forward because the tuner has a wafer-probe input port 146 and a waveguide flange 1401 output port. Such a calibration is only possible using an adapter-removal technique (see ref. 9). What is needed is de-embedding using s-parameters measured using the VNA 140, connected with the device using waveguide transmission lines 143 and controlled by the PC 142 using digital cables 141, between points 148 and 1401, and measuring the tuner s-parameters as a function of the tuning probe(s) positions. The calibration executes in two phases: in a first phase the VNA is calibrated using waveguide standards between waveguide flanges 1401 and 1402 and the calibration is saved as WG-CAL. Then the tuner-adapter 145 and the unmodified waveguide-to-wafer-probe adapter 1403, which includes wafer probe #147, are inserted, the tuning probes of the tuner 145 are withdrawn and a TRL calibration at wafer-probe level 148 is executed using the VNA calibration WG-CAL; this TRL calibration on wafer-probe level yields s-parameters of adapter 1403; subsequently s-parameters between reference points 1402 and 1401 are measured for a pre-selected multitude of tuning probe positions of the tuner 145 and de-embedded (cascaded with the inverse s-parameter matrix of the adapter 1403); this yields s-parameters of the module 146-145-1401, i.e., the waveguide-adapter-tuner between points 148 and 1401.

The calibration procedure itself proceeds as follows: after the VNA is mixed-calibrated, one VNA port being a wafer probe set of pins and the other port being a waveguide flange, then the WG2WP adapter is inserted between the VNA ports and the two tuning probes are placed to initial positions: tuning probe #1 at X1=0 and tuning probe #2 at X2=0; then scattering (s-) parameters are measured and saved in an init matrix [S0]; then, in a first measurement loop, tuning probe #1 is moved in a number of N (typically 100) steps ΔX=(int)(XMAX/N) from X1=0 to X1=XMAX and s-parameters are measured and saved in a matrix [S1]=[S(X1,0)] containing 4 sets of two-port s-parameters Sij(X1,0). In a next measurement loop tuning probe #1 is returned to its initial position X1=0 and tuning probe #2 is moved from X2=0 to XMAX in ΔX steps and s-parameters are measured and saved in a matrix [S2]=[S(0, X2)]. The total data are saved in data files S1 and S2 comprising N sets of s-parameters each. By the way, dividing the tuning probe travel to the same number of equal steps is not mandatory. The calibration method and the tuning method work also with different values, but, since the tuning probes have the same function and the frequency is the same, it is a matter of simplicity and convenience using the same values.

In a next step the hitherto measured calibration data of the individual tuning probes are used to generate the tuner calibration file as follows: for all X1, X2 permutations, symbolized as {X1,X2}, cascade the s-parameter matrices [S1], [S2] and [S0] as follows: [S1]*[S0]$^{-1}$*[S2] and save in a tuner calibration file C(F); the s-parameter data in file C(F) include sets of WG2WP adapter s-parameters between the wafer probe pins and the waveguide flange for all N$^2$ permutations of X1 and X2 positions every ΔX=(int)(XMAX/N) steps.

Figure 8:
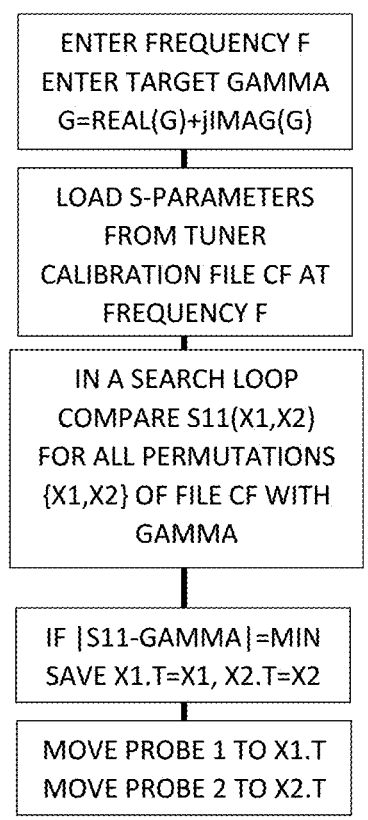
FIG. 8 depicts the impedance synthesis flow-chart.
Figure 9:
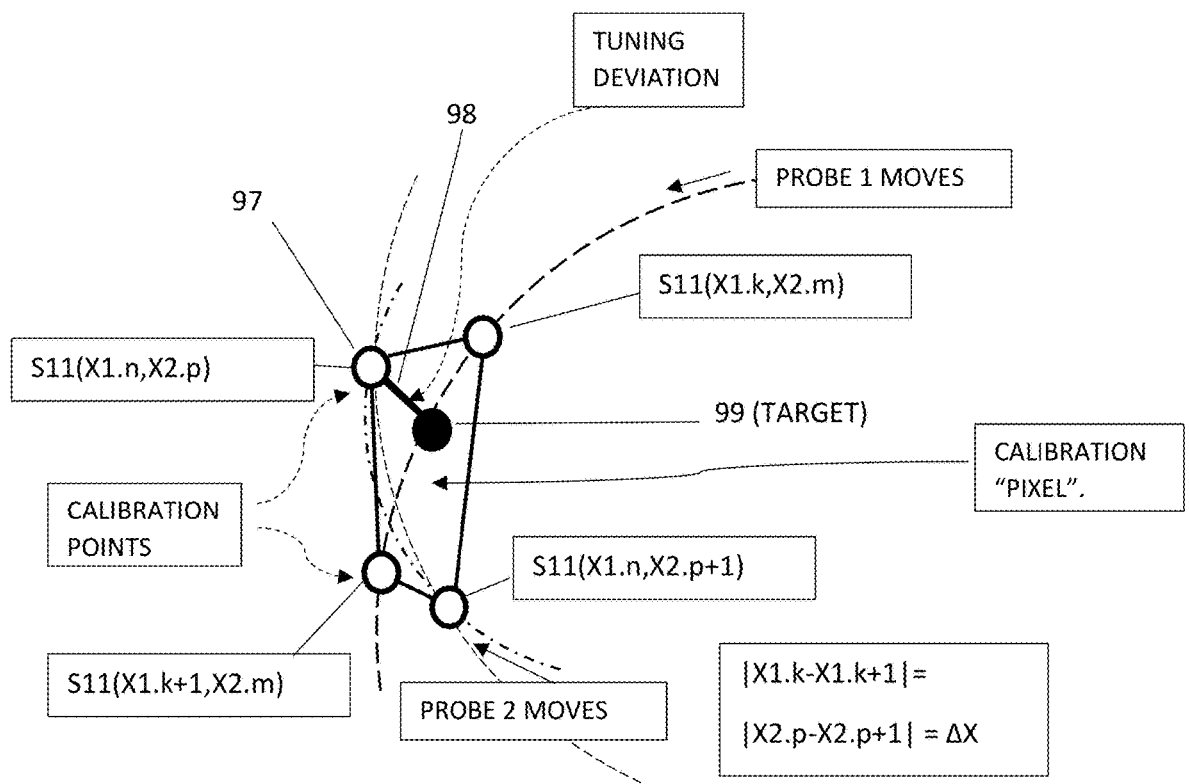
FIG. 9 depicts capturing a TARGET reflection factor inside a calibration "pixel".

Tuning is the procedure of synthesizing a TARGET reflection factor using the tuning probes of the calibrated WG2WP adapter, i.e., determining the best tuning probe positions X1, X2 that create a desired reflection factor 99 at the wafer probe pins, facing the DUT (see tuning algorithm in FIG. 8 and pixel TARGET capturing details in FIG. 9). Tuning accuracy is the vector difference 98 between the user-defined target reflection factor 99 and the closest synthesized calibration point 97. Assuming the tuner is calibrated at 100×100=10,000 settings (X1, X2): in a first rough approximation, on the Smith chart with a radius of 1 having a surface of π, the average size of each pixel is π/10$^4$ and, in a worst case scenario, as shown in FIG. 6, item 99, if a target is in the center of a contour defined by the surrounding pixel 106 (four calibrated points), the possible error, i.e., the logarithmic (in dB) difference of the closest calibrated point from the target is 20 log(sqrt(π/2)*10$^{-2}$))≈−38 dB; in this case tuning is a simple search through the data points vector S11(X1,X2) of the calibration file C using an error function EF=|TARGET-S11| to minimize. This search could use optimized searching Real(S11) and Imag(S11) separately and should not last more than a few milliseconds. If the accuracy of −38 dB seems too coarse, then the number of calibrated points could be increased to 150 or 200 per axis with, still reasonable, calibration time and reach accuracies of 20 log(sqrt(π/2)/3*10$^{-2}$))≈−41 dB or 20 log(sqrt(π/(2)/ 4*10$^{-2}$))≈−44 dB etc. Even if every doubling of the number of horizontal steps doubles the, already inherently low, calibration time, it increases the worst-case accuracy by at least 6 dB.

Obvious alternative embodiments of the presented embodiment of a load pull tuner integration in a waveguide to wafer probe (WG2WP) adapter with two fixed-penetration tuning probes, inserted into the adapter waveguide and associated calibration and tuning methods shall not impede on the core idea of the present invention.

What is claimed is:

1. A load pull tuner incorporated in a waveguide-to-wafer-probe adapter comprising:
   a partly slotted waveguide-to-wafer-probe adapter, and
   two mobile reflective tuning probes, a first tuning probe and a second tuning probe, and remote control of the tuning probes,
   wherein
   the partly slotted waveguide-to-wafer-probe adapter comprises:
      a rectangular waveguide transmission line having a top and a bottom broad wall and two narrow side walls and is divided into three sections joined by knee junctions: a sloped section between a vertical section and a horizontal section, the vertical section being attached to a wafer-probe head and the horizontal section being attached to a waveguide flange;
   and wherein
      the sloped section includes two slots, centered on the top broad wall along the waveguide, a first slot towards the vertical section and a second slot towards the horizontal section, said slots comprising a portion inside the sloped section and a protrusion inside and traversing the knee junctions;
   and wherein
      two mobile carriages, a first mobile carriage and a second mobile carriage, are saddled on and slide along the sloped section of the waveguide, controlled using stepper motors and appropriate gear;
   and wherein
      the first tuning probe is attached to the first mobile carriage and the second tuning probe is attached to the second mobile carriage;
   and wherein
      the tuning probes are inserted contactless at fixed penetration into the slots, the first tuning probe into the first slot and the second tuning probe into the second slot.

2. The load pull tuner incorporated in a-waveguide-to-wafer-probe adapter of claim 1, wherein
   the tuning probes are at least partly metallized rods.

3. The load pull tuner incorporated in a waveguide-to-wafer-probe adapter of claim 1, wherein
   the tuning probes are at least partly metallized dielectric pellets.

4. The load pull tuner incorporated in a waveguide-to-wafer-probe adapter of claim 1, wherein
   the tuning probes are initialized by moving them to withdrawal positions inside the protrusion of the slots into the sloped-to-vertical and the sloped-to-horizontal knee junctions defining associated initialization (withdrawal) positions X1=0 and X2=0,
   and wherein
   the first carriage moves the first tuning probe to a position X1 from the initialization position X1=0 and the second carriage moves the second tuning probe to a position X2 from the initialization position X2=0.

5. A calibration method for the load pull tuner incorporated in a waveguide-to-wafer-probe adapter of claim 4, comprising the following steps:
   a) connect the waveguide-to-wafer-probe adapter to a VNA calibrated at a frequency F, associated with a half wavelength of XMAX motor steps;
   b) move the first tuning probe to the initialization position X1=0 and the second tuning probe to the initialization position X2=0;
   c) measure s-parameters and save in an init matrix [S0];
   d) in a first move-measurement loop
      d1) move the first tuning probe from X1=0 to at least X1=XMAX in a multitude of N>10 steps of ΔX=int (XMAX/N),
      d2) measure s-parameters and save in a file S1(X1, X2=0);
   e) return the first tuning probe to the initialization position X1=0;
   f) in a second move-measurement loop
      f1) move the second tuning probe from X2=0 to at least X2=XMAX in a multitude of N steps of ΔX=int (XMAX/N),
      f2) measure s-parameters and save in a file S2(X1=0, X2);
   g) retrieve s-parameters Sij(X1,O) from file S1 and Sij (0, X2) from file S2;
   h) in a numerical loop cascade (convert to transfer T-format, multiply and convert back to s-format) all s-parameter permutations for {X1, X2} from step g) as follows: [T1]*[T0]$^{-1}$*[T2], convert back to s-format and save as Sij(X1,X2) in a calibration file C(F).

6. An impedance synthesis (tuning) method for the load pull tuner incorporated in a waveguide-to-wafer-probe adapter of claim 5 comprising the following steps:
   a) enter a frequency F;
   b) enter a complex target reflection factor Gamma=Real (Gamma)+j*Imag (Gamma);
   c) load s-parameters Sij (X1, X2) from the calibration file C(F) in dynamic computer memory;
   d) in a search loop
      d1) compare S11(X1, X2) with Gamma for all combinations {X1, X2};
      d2) if the amplitude of the vectorial difference |S11(X1, X2)-Gamma| is minimum, move the first tuning probe to X1 and the second tuning probe to X2;
   e) terminate.

7. The load pull tuner incorporated in a waveguide-to-wafer-probe adapter of claim 1, wherein
   the portion of the slots inside the cavity are at least one half of a wavelength (λ/2) long at a minimum operation frequency (Fmin) of the waveguide-to-wafer-probe adapter.

8. The load pull tuner incorporated in a waveguide-to-wafer-probe adapter of claim 1, wherein
   the carriages are moved by remotely controlled stepper motors and appropriate gear.

9. The load pull tuner incorporated in a waveguide-to-wafer-probe adapter of claim 1, wherein
   the tuning probes are inserted into the slots without contacting the waveguide walls.

* * * * *